United States Patent [19]

DeBar

[11] 4,392,209
[45] Jul. 5, 1983

[54] RANDOMLY ACCESSIBLE MEMORY DISPLAY

[75] Inventor: David E. DeBar, Manassas, Va.

[73] Assignee: IBM Corporation, Armonk, N.Y.

[21] Appl. No.: 249,555

[22] Filed: Mar. 31, 1981

[51] Int. Cl.³ ............................................. G11C 13/08
[52] U.S. Cl. ..................................... 365/110; 365/215
[58] Field of Search ................ 365/110, 111, 112, 215

[56] References Cited

U.S. PATENT DOCUMENTS

| | | | |
|---|---|---|---|
| 3,160,859 | 11/1959 | Wilmotte | 340/173 |
| 3,590,252 | 6/1971 | Lake | 250/213 |
| 3,761,897 | 9/1973 | Tech | 340/173 PL |
| 4,035,774 | 7/1977 | Chang | 365/110 |

FOREIGN PATENT DOCUMENTS

| | | | |
|---|---|---|---|
| 52-30191 | 3/1977 | Japan | 365/110 |
| 52-72129 | 6/1977 | Japan | 365/110 |
| 52-77547 | 6/1977 | Japan | 365/110 |
| 856930 | 3/1957 | United Kingdom . | |

OTHER PUBLICATIONS

Keller, "Storage Device Using Phosphors", IBM Tech. Disc. Bul., vol. 1, No. 1, 6/58, p. 38, 1958-06-00.

Primary Examiner—Stuart N. Hecker
Attorney, Agent, or Firm—Maurice H. Klitzman

[57] ABSTRACT

A randomly accessible memory display is disclosed wherein a latching memory panel can be placed in direct optical contact with the triggering electroluminescent panel having a similar matrix. Once the glowing light from the trigger panel shines on the photosensitive resistive layer providing positive feedback, the corresponding region in the latching memory panel is latched. In accordance with the invention, a technique is disclosed for electrically reading the latched state in any one cell. This is done by selectively propagating a high frequency sinusoidal interrogation signal through each of the Y axis lines connected to the cells and measuring any phase alteration in each of the X axis lines connected to the cells, for each Y axis line interrogated. Since the resistance of the photosensitive resistor for a particular latching cell is altered if that cell is emitting light, the impedance of the cell is changed, thereby introducing a phase shift to the interrogation signal. The detection of the phase shift indicates whether the selected cell is latched in its light-emitting or light-extinguished state.

2 Claims, 3 Drawing Figures

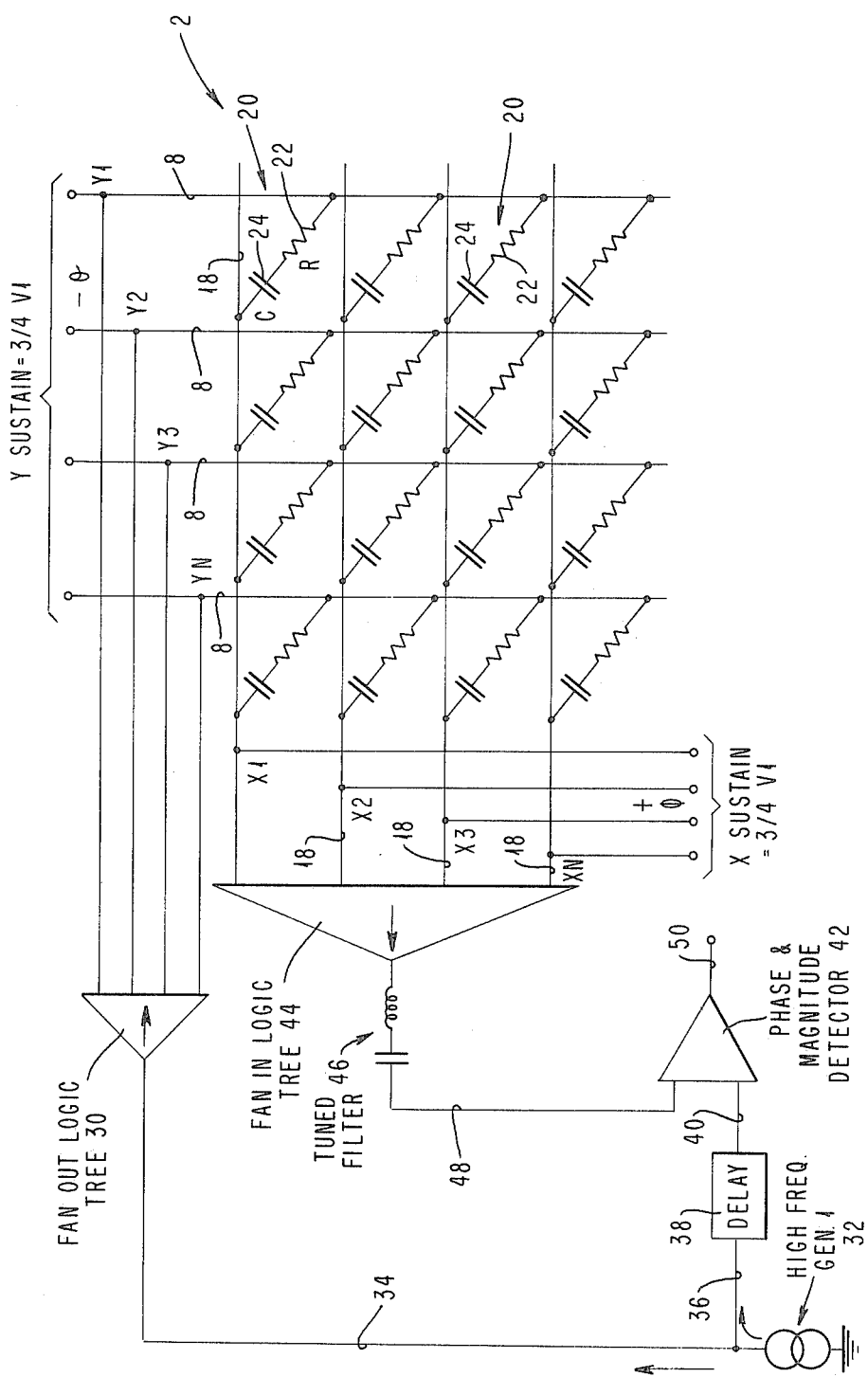

RANDOMLY ACCESSIBLE MEMORY DISPLAY

FIELD OF THE INVENTION

The invention disclosed broadly relates to data display and storage devices and more particularly relates to electroluminescent data display and storage devices.

BACKGROUND OF THE INVENTION

There are a variety of physical light emitting mechanisms employed in display technology and suitable techniques for accessing data to be displayed in these technologies have been developed. For example U.S. Pat. No. 3,761,897 to Tech (assigned to the instant assignee) describes a gas cell memory system with electrical readout. The accessing technique described in that patent electrically determines the latched state of any one cell to selectively write or erase it. A pulse equal to or greater than the sustain level is applied to a selected line on one axis while all lines on the other axis are sensed. The presence of the pulse in the sensed line indicates a binary one or lighted cell and the absence of pulse indicates a binary zero or unlit cell. In this manner, the state of individual cells may be determined electrically. However, there is a significant problem with applying this pulse magnitude technique to reading the stored state in electroluminescent panel displays. The change in impedance between the lit and unlit cell in an electroluminescent panel display is so small that the corresponding change in the magnitude of interrogation pulses propagated through such a cell is indistinguishable from background noise and leakage.

OBJECTS OF THE INVENTION

It is therefore an object of the invention to provide an improved accessing technique for an electroluminescent display.

It is a further object of the invention to provide an improved technique for interrogating an electroluminescent display, which provides a relatively large sensing energy.

SUMMARY OF THE INVENTION

These and other objects, features and advantages of the invention are accomplished by the randomly accessible memory display invention disclosed herein. A randomly accessible memory display is disclosed wherein a latching memory panel can be placed in direct optical contact with the triggering electroluminescent panel having a similar matrix. Once the glowing light from the trigger panel shines on the photosensitive resistive layer providing positive feedback, the corresponding region in the latching memory panel is latched. In accordance with the invention, a technique is disclosed for electrically reading the latched state in any one cell. This is done by selectively propagating a high frequency sinusoidal interrogation signal through each of the Y axis lines connected to the cells and measuring any phase alteration in each of the X axis lines connected to the cells, for each Y axis line interrogated. Since the resistance of the photosensitive resistor for a particular latching cell is altered if that cell is emitting light, the impedance of the cell is changed, thereby introducing a phase shift to the interrogation signal. The detection of the phase shift indicates whether the selected cell is latched in its light-emitting or light-extinguished state.

DESCRIPTION OF THE FIGURES

These and other objects, features and advantages of the invention will be more fully appreciated with reference to the accompanying figures.

FIG. 2 is a schematic circuit diagram of the latching memory panel accessing circuitry.

DISCUSSION OF THE PREFERRED EMBODIMENT

Figure 1:
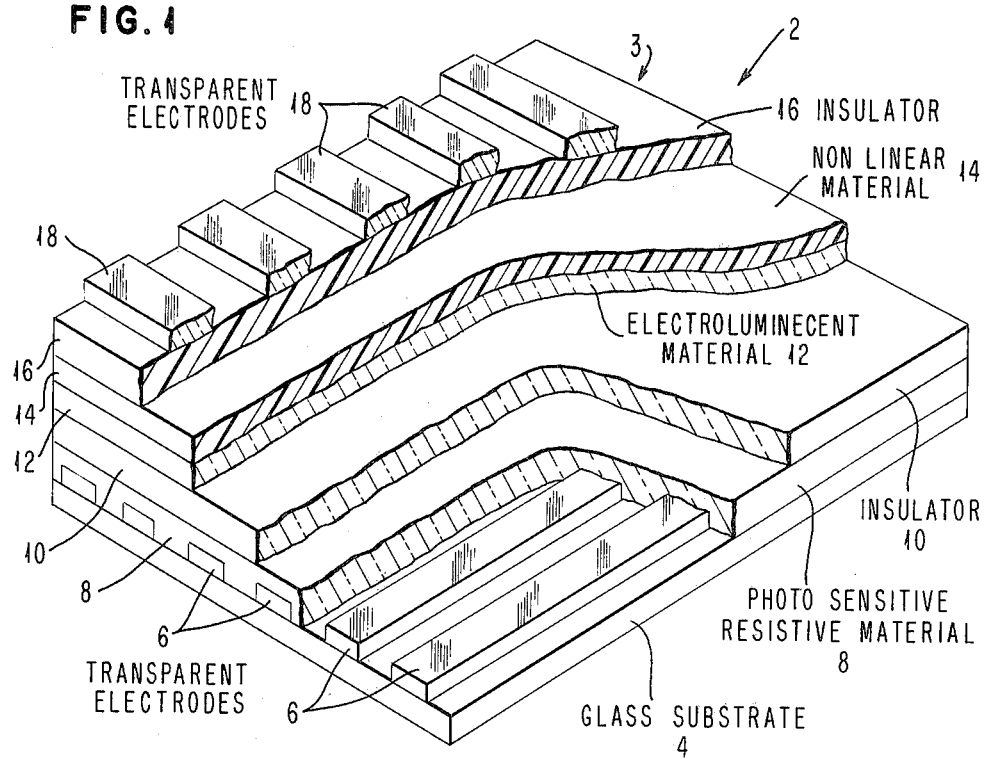
FIG. 1 is a breakaway view of the latching memory panel in accordance with the invention.

A randomly accessible memory display is disclosed wherein a latching memory panel 2 such as is shown in FIG. 1, can be placed in direct optical contact with the triggering electroluminescent panel having a similar matrix. One example of a triggering panel in direct optical contact with a latching memory panel is shown in U.S. Pat. No. 3,590,252 to Lake. Once the glowing light from the trigger panel shines on the photosensitive resistive layer of panel 2 providing positive feedback, the corresponding region in the latching memory panel 2 is latched.

In the circuit of FIG. 2, a number N of independent sine wave voltages of a magnitude equal to three-fourths of the latching voltage are all of the same phase and are applied to the Y axis electrodes of the latching memory panel 2. In a similar manner, a number N of independent sine wave voltages of a magnitude equal to three-fourths of the latching voltage are applied in phase to the X axis electrodes of the latching memory panel 2. The voltages applied to the X axis are 180° out of phase with the voltages applied to the Y axis and therefore, when the X and Y voltages are coincident on a particular cell, a potential difference of 1.5 times the latching voltage is applied to the cell. Thus, once a cell of the latching memory panel 2 has been triggered to light up, it will continue to be lit. The light emitted from the cell, represented as a capacitance C in FIG. 2, lowers the resistance of the series-connected photoresistor R in FIG. 2, thereby applying approximately the full potential difference between X and Y lines across the electroluminescent cell of the latching memory panel 2.

The inventive concept lies in the technique for electrically reading the latched state of any one cell in the panel 2. This is done by selectively propagating a high frequency sinusoidal interrogation signal through one of the Y axis lines of the latching memory panel 2 and selectively measuring any phase alteration in one of the X axis lines for each Y axis line interrogated. Since the resistance of the photosensitive resistor for a particular latching cell is altered if that cell is emitting light, the impedance of the cell is changed, thereby introducing a phase shift to the interrogation signal propagated through that cell. The general relationship between the phase of a sinusoidal signal propagated through a series circuit of a resistor and a capacitor and the impedance of that circuit is described, for example, by Lewis and Goodheart, *Basic Electric Circuit Theory,* Ronald Press 1958, pages 56–60. The detection of the phase shift of the interrogation signal when propagated through a cell indicates whether the selected cell is latched in its light-emitting or light-extinguished state. The resistance and impedance properties of electroluminescent cells such as are in the latching memory panel 2, are described in U.S. Pat. No. 2,836,766 to Halstead and in U.S. Pat. No. 2,975,290 to Spitzer.

FIG. 1 shows a cross-sectional view of how a latching memory panel 2 can be manufactured in a laminated matrix array configuration. Examples of the composition of the layers in the panel 2 are as follows. The photosensitive material 8 can be ZnS, ZnO or GaN. The electroluminescent material 12 can be ZnS, Zn(S,Se) or (Zn,Cd)S. The insulators 10 and 16 can be glass. The nonlinear material 14 can be CdSe. Other conventional compositions can also be employed. This array can be placed in direct optical contact with a triggering electroluminescent panel with an identical matrix, as described in the above-referenced Lake patent.

The sequence of events for a latching operation is as follows. Light from a selected cell on the trigger panel passes through the glass 4 of the latching memory panel 2 and through the transparent electrodes 6 to the photosensitive resistive material 8, lowering the resistance of the layer 8 in a small isolated spot. The reduced resistance of layer 8 enables the application of approximately the full potential difference between electrodes 6 and 18 across the phosphor 12, causing it to glow in a region 20 of the memory panel 2 directly over the glowing portion of the trigger panel. Once this glowing of the phosphor layer 12 starts, the light shines back on the photosensitive resistive layer 8 providing positive feedback, and assuring latching of the lit state of the cell. Because the electrodes 6 and 18 are arranged in a matrix, an electric field strong enough to sustain latching is only present at the locus 20 of the intersection of mutually perpendicular electrodes. This prevents the "bleeding" of the light from one cell 20 to its neighboring cells 20. Once the latching has occurred, the trigger panel need no longer be lit. The corresponding cell 20 on the memory panel 2 will remain lit and can be viewed from the top side 3 (viewing side).

Cells of the memory panel 2 can also be latched by shining a light of sufficient intensity and proper frequency through the viewing side 3 of the memory panel 2 to the photosensitive resistive layer 8. For excitation by external light to work, the electroluminescent layer 12 and all other layers with the exception of the photosensitive resistive material 8 must be transparent. An alternative to a transparent electroluminescent layer 12 would be a small clear window or via hole in the center of each cell 20 through the opaque electroluminescent layer 12 to provide an optical path from the viewing side 3 to the photosensitive resistive layer 8. An example of such optical via holes in electroluminescent panels is shown in U.S. Pat. No. 2,920,232 to Evans.

The memory panel 2 of FIG. 1 can be connected in an electrical circuit to provide the ability to electrically write into or extinguish selected cells 20 and to electrically interrogate the state (on-off) of any cell 20. A number N of independent sine wave voltages of a magnitude equal to three-fourths V1, all of the same phase, are applied to the electrodes 8 of the Y axis. V1 is the minimum voltage that will cause latching (see FIG. 3). In like manner a number N of independent voltages of a magnitude equal to three-fourths V1 and all in phase with one another are applied to the X axis 18. The sine wave voltages applied to the X axis 18 are 180° out of phase with the voltage applied to the Y axis 8 and hence they add vectorially and their sum is two times three-fourths V1 or 1.5 V1 (see V3 of FIG. 3). V3 is equal to 1.5 V1 and will assure latching well into the saturation portion of the curve. The nonlinear material layer 14 shown in FIG. 1 provides the non-linear response characteristic shown in FIG. 3 and determines the magnitude of voltage V1. See, for example, Luxemburg and Kuehn, *Display Systems Engineering*, McGraw-Hill 1968, pages 387–388.

Figure 3:
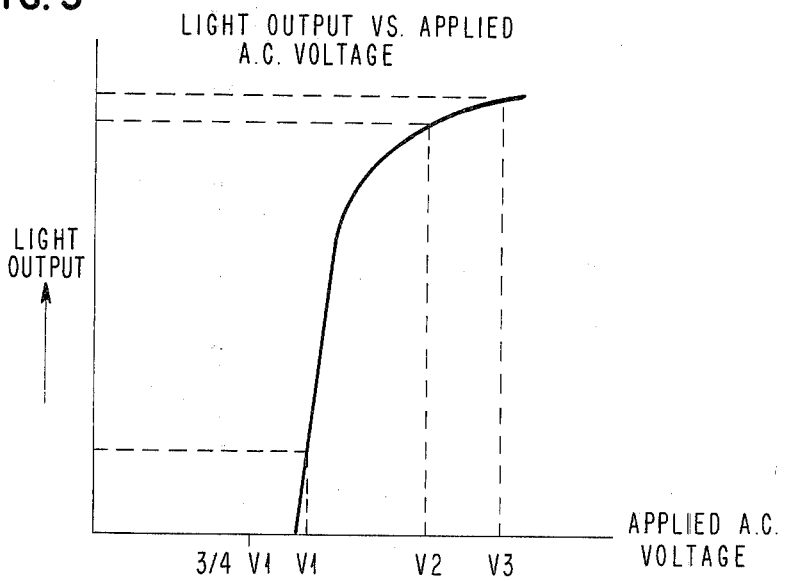
FIG. 3 is a graphical representation of the logarithm of the light output versus the applied AC voltage for the latching memory panel.

Each series C-R segment shown in FIG. 2 represents one latching cell 20 in the memory array 2. If a given cell 20 is to be extinguished, for example the cell at the intersection of drive lines Y3 and X3 (Y3,X3), the phase of the corresponding Y drive line (Y3) must be delayed by some angle Theta 1, e.g., 60° and at the same time the corresponding X drive (X3) must be advanced by some angle Theta 2, e.g., 60°. The overall effective voltage at the selected cell will then be less than V1. It can be shown that for the above example of Theta 1 and Theta 2 equal to 60°, their vector sum will be equal to three-fourths V1. The voltage across all other elements 20 in the array 2 will be the vector sum of their corresponding X and Y drive lines. It can further be shown that the worse case voltage for a nonselected cell would be equal to 1.3 V1 (see V2 of FIG. 3). Because V2 and V3 of FIG. 3 are both in the saturated portion of the response curve, the resulting small change in light output will not be noticeable. An example of drive line phase shifting circuits and a description of the principles of electrically writing into or electrically extinguishing an electroluminescent cell can be found in U.S. Pat. No. 3,946,371 to Inazaki, et al. Conventional, sinusoidal wave form phase shifting circuits can be employed to electrically write or erase a given cell 20 in the memory panel 2, as described above.

To enable the central processor in a data processing system to interrogate the state (on-off) of each element 20 in the latching memory panel 2, generator 32 of FIG. 2 provides a high frequency sinusoidal interrogation signal of a much greater frequency than the frequency of the sustain drive lines. (The optimum frequency for the interrogation signal is dependent on the particular intrinsic capacitance C of the phosphor elements 12 and the range and value of the resistance R of the photoresistive material 8. This high frequency interrogation signal is directed out over line 34 to the fan-out logic tree 30 and is mixed with the Y drive signal on a selected one of the Y sustain signal lines 8. The fan-in logic tree 44 will select and sample the voltage on a selected one of the X sustain lines 18. This sampled signal will then be filtered by the tuned filter 46 to pass only the high frequency interrogation signal component.

As the high frequency interrogation signal passes through a selected cell 20 in the latching memory panel 2, it will undergo a phase shift determined by the values of R and C. This phase shift will be significantly different in a cell latched in the lighted or on state from the phase shift in a cell latched in the unlighted or off state. The resultant phase shifted signal is filtered through the tuned filter 46, is input on line 48 to the phase detector 42 and is compared with the non-phase shifted signal which is output from the signal generator 32 on line 36 and, after suitable delay in the delay element 38, is applied on line 40 to the phase detector 42. The delay element 38 can be adjusted so that the phase detector 42 detects no phase difference between the signals on lines 40 and 48 for a cell in an unlighted or off state, for example. By measuring the amount of phase shift, the detector 42 will indicate at its output 50 whether the interrogated element is in an on or off state.

The resultant technique for reading the latched state of a cell in the memory panel 2 by detecting the magnitude of the phase shift of a high frequency interrogation signal propagated through that cell, overcomes the problem of discriminating between the small amplitude change of such an interrogation signal and background noise.

Although a specific embodiment of the invention has been disclosed, it will be understood by those of skill in the art that various changes may be made in the form and details therein without departing from the spirit and scope of the invention.

Having thus described our invention, what we claim as new, and desire to secure by Letters Patent is:

1. A randomly accessible memory display including an electroluminescent panel laminate having a first layer including a plurality of horizontal X electrodes and a second layer including a plurality of vertical Y electrodes, between said first and second layers there being a layer of electroluminescent material, and a layer of photoresistive material, said panel emitting light at a cell location when the potential difference between juxtaposed X and Y electrodes exceeds a sustaining voltage, each said cell forming a memory element with a first terminal series-connected with a Y-sustaining AC voltage and a Y electrode, and a second terminal series-connected with an X-sustaining AC voltage and an X electrode, the sum of the peak voltage for said X-sustaining AC voltage and said Y-sustaining AC voltage being greater than said sustaining voltage, wherein the improvement comprises:
 a high frequency sinusoidal voltage generator selectively connected to one of said Y electrodes for providing a sinusoidal interrogation signal;
 a phase detector having a first input connected to said high frequency sinusoidal voltage generator and a second input selectively connected to a corresponding one of said X electrodes;
 said phase detector indicating an alteration in the phase of said high frequency sinusoidal interrogation signal after transmission through a selected one of said cells in response to the altered conductivity of the corresponding portion of said photoresistive layer due to the light-emitting state of said selected cell;
 whereby the stored light-emitting state of a plurality of said cells on said electroluminescent panel can be accessed.

2. In a randomly accessible memory display including an electroluminescent panel laminate having a first layer including a plurality of horizontal X electrodes and a second layer including a plurality of vertical Y electrodes, between said first and second layers there being a layer of electroluminescent material, and a layer of photoresistive material, said panel emitting light at a cell location when the potential difference between juxtaposed X and Y electrodes exceeds a sustaining voltage, each said cell forming a memory element with a first terminal series-connected with a Y-sustaining AC voltage and a Y electrode, and a second terminal series-connected with an X-sustaining AC voltage and an X electrode, the sum of the peak voltage for said X-sustaining AC voltage and said Y-sustaining AC voltage being greater than said sustaining voltage, a method for reading the latched state of said cell, comprising the stpes of:
 selectively transmitting a high frequency sinusoidal interrogation signal voltage to one of said Y electrodes;
 detecting the phase difference of said high frequency sinusoidal interrogation signal between said generator and a selected one of said X electrodes;
 said detected phase difference indicating an alteration in the phase of said high frequency interrogation signal after transmission through a selected one of said cells corresponding to said selected X and Y electrodes in response to the altered conductivity of the corresponding portion of said photoresistive layer due to the light-emitting state of said selected cell;
 whereby the stored light-emitting state of a plurality of said cells on said electroluminescent panel can be accessed.

* * * * *